United States Patent [19]

Ichihara

[11] Patent Number: 5,784,412
[45] Date of Patent: Jul. 21, 1998

[54] TRANSMITTER AND METHOD FOR TRANSMITTING A MODULATED WAVE WITH VARIABLE ENVELOPE

[75] Inventor: Masaki Ichihara, Tokyo, Japan

[73] Assignee: NEC Corporation, Japan

[21] Appl. No.: 568,142

[22] Filed: Dec. 6, 1995

[30] Foreign Application Priority Data

Dec. 6, 1994 [JP] Japan .................. 6-301946

[51] Int. Cl.[6] ...................................... H03C 3/00
[52] U.S. Cl. ........................... 375/302; 332/103
[58] Field of Search ............................ 375/261, 279, 375/280, 281, 282, 283, 284, 302, 298, 308; 332/102, 103, 183, 184

[56] References Cited

U.S. PATENT DOCUMENTS 4,485,358  11/1984  Andren et al. .................. 332/23 R

*Primary Examiner*—Stephen Chin
*Assistant Examiner*—Kevin Kim
*Attorney, Agent, or Firm*—Ostrolenk, Faber, Gerb & Soffen, LLP

[57] ABSTRACT

A base band waveform generation circuit 10 calculates the equations: $I_1=\{I+Q\cdot SQRT(4/a^2-1)\}/2$; $Q_1=\{Q-I\cdot SQRT(4/a^2-1)\}/2$; $I_2=\{I-Q\cdot SQRT(4/a^2-1)\}/2$; and $Q_2=\{Q+I\cdot SQRT(4/a^2-1)\}/2$, based on I and Q of a modulating signal. Where, SQRT(x) refers to a square root of x, that is, $a^2=(I_2)^2+(Q_2)^2$. A quadrature modulator 12 quadrature modulates a carrier with the $I_1$ and $Q_1$. A quadrature modulator 22 quadrature modulates a carrier with the $I_2$ and $Q_2$. The output signals of the quadrature modulators 12 and 13 are amplified with a transmission power amplifiers 13 and 23, then composed.

14 Claims, 3 Drawing Sheets

TRANSMITTER AND METHOD FOR TRANSMITTING A MODULATED WAVE WITH VARIABLE ENVELOPE

BACKGROUND OF THE INVENTION

The present invention relates to an art for transmitting a modulated wave with variable envelope, such as 4-phase Phase Shift Keying (hereinafter referred to as PSK), π/4 shift Differential Quadrature Phase Shift Keying (hereinafter referred to as DQPSK) and the like.

A conventional digital cellular phone system employs a linear modulation method using a modulated wave with a narrow band width such as π/4 shift DQPSK for efficient use of frequency. However this linear modulation method varies the amplitude of transmission radio wave to a great degree compared to the conventional constant envelope modulation method (where the envelope does not vary) employing Frequency Modulation (hereinafter referred to as FM), Gaussian Minimum Shift Keying (hereinafter referred to as GMSK) modulation and the like. As a result, a transmitter is required to transmit the above-described amplitude variation accurately. That is why a linear amplifier has to be used in spite of its ineffectiveness.

FIG. 3 shows a block diagram of a conventional transmitter.

A base band waveform generation circuit 1 receives an incoming input data signal 7, synchronizing with a clock 8 and outputs corresponding base band signals (modulating signal) I and Q, respectively. The signal I refers to an in-phase component of the transmission radio wave to the carrier. The signal Q refers to a quadrature component.

These signals are input to an quadrature modulator 2 for quadrature modulating a local signal (carrier) output from a local oscillator 6. Output signals (modulated signal) of the quadrature modulator 2 are amplified with a transmission power amplifier 3 and transmitted from an antenna 5 after eliminated unnecessary waves through a transmission filter 4.

The output of the quadrature modulator 2 as linear modulation such as π/4 shift DQPSK, QPSK and the like, is accompanied with the envelope amplitude variation because of using no constant envelope modulation. The transmission power amplifier 3 has to be a linear amplifier in order to reproduce the envelope amplitude variation as accurate as possible.

FIG. 4 is a graphical representation of characteristics of a transmission power amplifier. An axis of abscissa is an input level, a left axis of ordinates is an output level and a right axis of ordinates is efficiency. The solid line designates a relationship between input power and output power. The dotted line designates a relationship between the input power and efficiency.

The conventional transmission method has no chance but uses the area where the output power linearly varies to the input power in order to conduct linear amplification. This area, however, exhibits quite low efficiency. Moreover the conventional method increases power consumption for transmission compared with the constant envelope modulation method applicable in the non-linear area (lower right section of the graph of FIG. 4).

The above described conventional method for amplifying the linear modulated wave with the linear amplifier exhibits quite low power efficiency, resulting in excessive power consumption increase.

SUMMARY OF THE INVENTION

It is an object of the invention to provide a solution for the aforementioned problem.

Another object of the invention is to provide a transmitter and a method enabling to use a non-linear and efficient amplifier for transmission power amplification.

The aforementioned present invention is achieved by a converter for converting a modulating signal with envelope variation to two modulating signals without envelope variation, the converter comprising means for converting a signal of the modulating signal with envelope variation of which in-phase component signal is I and quadrature component signal is Q to a signal of which in-phase component signal is $I_1$, and quadrature component signal is $Q_1$ and a signal of which in-phase component signal is $I_2$, and quadrature component signal is $Q_2$ that meet the following conditions (1) to (3):

$$(I_1)^2 + (Q_1)^2 = \text{constant} \quad (1)$$

$$(I_2)^2 + (Q_2)^2 = \text{constant} \quad (2)$$

$$\text{Vector } (I,Q) = \text{Vector } (I_1,Q_1) + \text{Vector } (I_2,Q_2) \quad (3).$$

Moreover, the aforementioned present invention is achieved by a transmitter comprising:

means for converting a signal of the modulating signal with envelope variation of which in-phase component signal is I and quadrature component signal is Q to a signal (of which in-phase component signal is I1, and quadrature component signal is Q1) and a signal (of which in-phase component signal is I2, and quadrature component signal is Q2) that meet the following conditions (1) to (3):

$$(I_1)^2 + (Q_1)^2 = \text{constant} \quad (1)$$

$$(I_2)^2 + (Q_2)^2 = \text{constant} \quad (2)$$

$$\text{Vector } (I,Q) = \text{Vector } (I_1,Q_1) + \text{Vector } (I_2,Q_2) \quad (3),$$

a first modulation means for modulating a carrier with the signal $(I_1,Q_1)$ and generating a first modulated wave;

a second modulation means for modulating a carrier with the signal $(I_2,Q_2)$ and generating a second modulated wave;

a first amplification means for power amplifying the first modulated wave;

a second amplification means for power amplifying the second modulated wave; and means for composing outputs signals of the first amplification means and the second amplification means.

Furthermore, the aforementioned present invention is achieved by a method for transmitting a modulated wave with envelope variation, the method comprising steps of:

converting a signal of the modulating signal with envelope variation of which in-phase component signal is I and quadrature component signal is Q to a signal of which in-phase component signal is $I_1$, and quadrature component signal is $Q_1$ and a signal of which in-phase component signal is $I_2$, and quadrature component signal is $Q_2$ that meet the following conditions (1) to (3):

$$(I_1)^2 + (Q_1)^2 = \text{constant} \quad (1)$$

$$(I_2)^2 + (Q_2)^2 = \text{constant} \quad (2)$$

$$\text{Vector } (I,Q) = \text{Vector } (I_1,Q_1) + \text{Vector } (I_2,Q_2) \quad (3);$$

a first modulation step of modulating a carrier with the signal $(I_1,Q_1)$ and generating a first modulated wave;

a second modulation step of modulating a carrier with the signal $(I_2,Q_2)$ and generating a second modulated wave;

a first amplification step of power amplifying the first modulated wave;

a second amplification step of power amplifying the second modulated wave;

composing the first power amplified modulated wave and the second power amplified modulated wave;

band limiting a composed modulated wave; and transmitting a band limited modulated wave.

The present invention converts a modulating signal of which amplitude is variable (i.e., of which envelope is variable) to two constant envelope modulating signals. Then the present invention modulates, amplifies and composes respective carriers by using respective constant envelope modulating signals. Thus, the present invention allows to use a non-linear and highly efficient amplifier, resulting decreasing of power consumption.

BRIEF DESCRIPTION OF THE DRAWINGS

This and other objects, features and advantages of the present invention will become more apparent upon a reading of the following detailed description and drawings, in which.

DESCRIPTION OF THE PREFERRED EMBODIMENTS

A principle of the present invention is hereinafter described.

Figure 1:
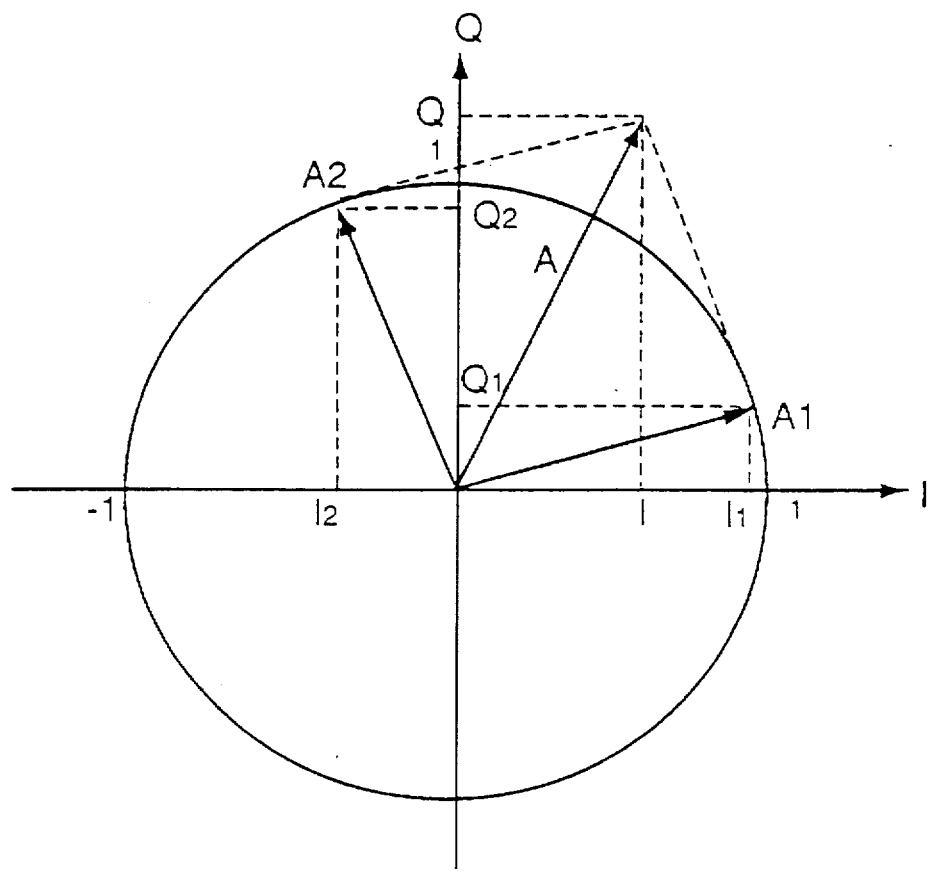
FIG. 1 is a figure for explaining a principle of the present invention.

FIG. 1 is a vector representation of phase and amplitude of a signal.

Assuming that a vector of a transmission modulating signal is designated as A, in-phase component to the carrier is designated as I and quadrature component is designated as Q, the vector A is expressed as the following coordinate:

$$A=(I, Q) \quad (1)$$

Assuming that an amplitude "a" of the vector A is variable, each vector of A1 and A2 is supposed to have a constant amplitude with its value equal to or more than ½ of the maximum value of the amplitude "a". It is assumed that A1 and A2 have the same amplitude values of 1 for simplification (i.e., a≦2). The vectors A1 and A2 are expressed as the following coordinates:

$$A1=(I_1, Q_1), A2=(I_2, Q_2)$$

The values of $I_1$, $Q_1$, $I_2$ and $Q_2$ are selected so that the sum of the vectors A1 and A2 is equal to the vector A.

Each of the above value is obtained by the following equations of (3-1) to (3-4).

$$I_1=\{I+Q \cdot SQRT(4/a^2-1)\}/2 \quad (3\text{-}1)$$

$$Q_1=\{Q-I \cdot SQRT(4/a^2-1)\}/2 \quad (3\text{-}2)$$

$$I_2=\{I-Q \cdot SQRT(4/a^2-1)\}/2 \quad (3\text{-}3)$$

$$Q_2=\{Q+I \cdot SQRT(4/a^2-1)\}/2 \quad (3\text{-}4)$$

where SQRT(x) refers to a square root of the x. The above equations (3-1) to (3-4) obviously show that: $I_1^2+Q_1^2=1$ and $I_2^2+Q_2^2=1$. This represents that signals $(I_1,Q_1)$ and $(I_2,Q_2)$ are constant envelope modulating signals, respectively.

This also shows that: $(I_1,Q_1)+(I_2,Q_2)=(I, Q)$

As aforementioned, it is possible to obtain an envelope modulating signal with variable phase component (I, Q) by generating the constant envelope modulating signal with the phase component of $(I_1,Q_1)$ and the the same valued constant envelope modulated wave with the phase component of $(I_2,Q_2)$ and amplifying and composing them with the same gain.

Figure 2:
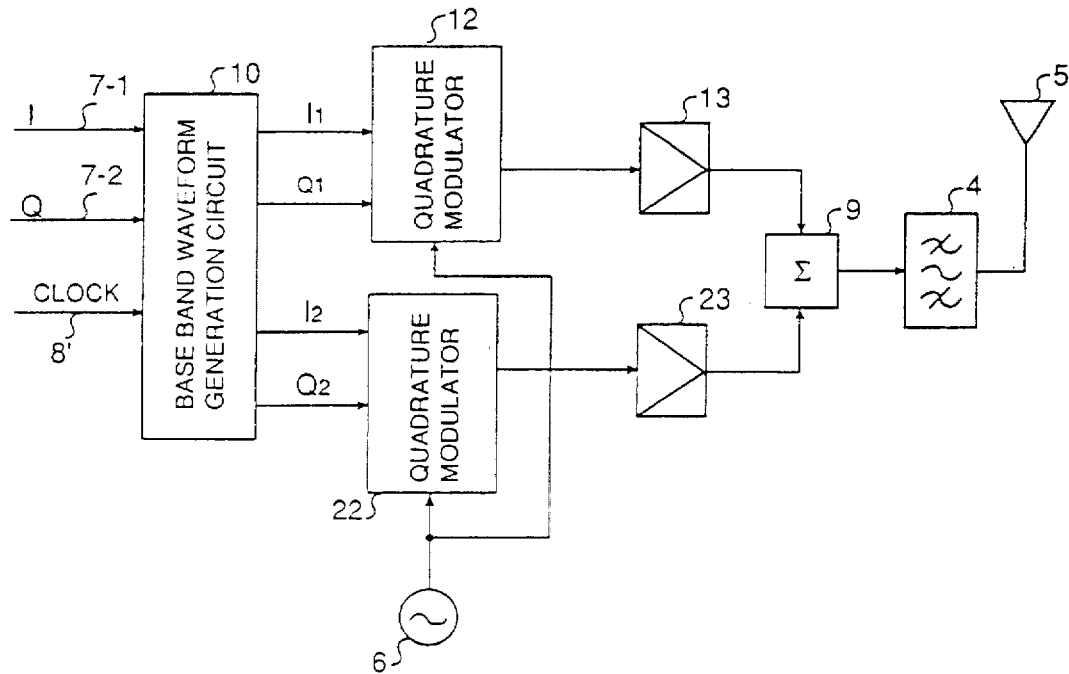
FIG. 2 is a block diagram of an embodiment of the present invention.
Figure 3:
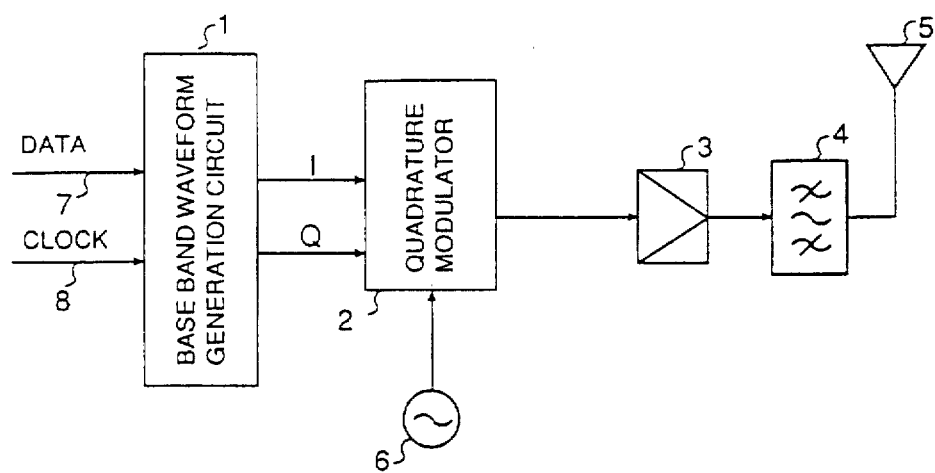
FIG. 3 is a block diagram of a conventional transmitter.
Figure 4:
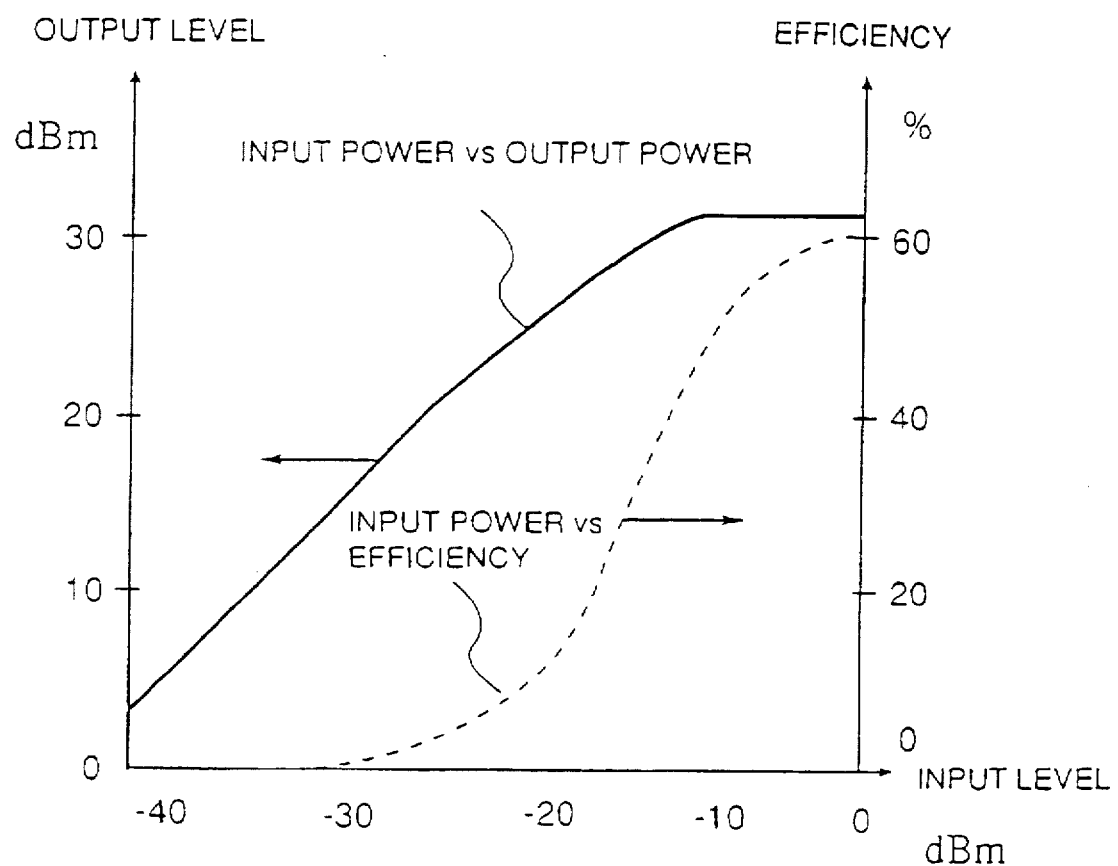
FIG. 4 is a figure showing characteristics of a transmission power amplifier.

A transmitter of the present invention is described referring to FIG. 2.

As shown in FIG. 2, the transmitter of the present invention comprises a base band waveform generation circuit (converter) 10 for outputting base band signals (modulating signals) $I_1$, $Q_1$, $I_2$ and $Q_2$ based on an in-phase component signal I, quadrature component signal (modulating signal) Q and a clock 8 synchronized with input data; a first quadrature modulator 12 for quadrature modulating a local signal (carrier) output from a local oscillator 6 by using the in-phase component signal $I_1$ and the quadrature component signal $Q_1$; a second quadrature modulator 22 for quadrature modulating a local signal (carrier) by using the in-phase component signal $I_2$ and the quadrature component signal $Q_2$; a first transmission power amplifier 13 for amplifying the output signal of the first quadrature modulator 12, a second transmission power amplifier 23 for amplifying the output signal output from the second quadrature modulator 22, a power composition device 9 for composing output signals of the transmission power amplifiers 13 and 14; a band pass filter 4 for band limiting the output signal of the power composition device 9 and an antenna 5 for transmitting the output signal of the band pass filter 4.

The base band waveform generation circuit 10 (the converter) applies equations (3-1) to (3-4) to the input data 7, supplies the in-phase component signal $I_1$ and the quadrature component signal $Q_1$ to the first quadrature modulator 12 and supplies the in-phase component signal $I_2$ and the quadrature component signal $Q_2$ to the second quadrature modulator 22.

Where, the base band waveform generation circuit 10 comprises a digital signal processor in which a software for calculating equations (3-1) to (3-4) is embedded.

The first quadrature modulator 12 quadrature modulates the local signal (carrier) output from the local oscillator 6 with the in-phase component signal $I_1$ and the quadrature component signal $Q_1$.

The second quadrature modulator 22 quadrature modulates the local signal (carrier) with the in-phase component signal $I_2$ and the quadrature component signal $Q_2$.

Output signals of the first quadrature modulator 12 and the second quadrature modulator 22 are power amplified through the first transmission power amplifier 13 and the second transmission power amplifier 23, respectively. Since the output signals of the first and the second quadrature modulators 12 and 22 are constant envelope modulated waves processed through the base band waveform generation circuit 10 as aforementioned, no distortion occurs in spite of power amplification with the non-linear and highly efficient power amplifier.

The output signals of the first and the second transmission power amplifiers 13 and 23 are power composed through the power composition device 9. As a result, with the output signal of the power composition device 9, the local signal (carrier) is quadrature modulated with the in-phase component signal I and the quadrature component signal, thus providing the signal comparable to that of power amplified with no distortion.

The output signal of the power composition device 9 is supplied to the antenna 5 for transmission, after band limited with the band pass filter 4.

What is claimed is:

1. A transmitter comprising:

means for converting a signal of said modulating signal with envelope variation of which in-phase component signal is I and quadrature component signal is Q to a signal of which in-phase component signal is $I_1$, and quadrature component signal is $Q_1$ and a signal of which in-phase component signal is $I_2$, and quadrature component signal is $Q_2$ that meet the following conditions (1) to (3):

$$(I_1)^2+(Q_1)^2=\text{constant} \quad (1)$$

$$(I_2)^2+(Q_2)^2=\text{constant} \quad (2)$$

$$\text{Vector }(I,Q)=\text{Vector }(I_1,Q_1)+\text{Vector }(I_2,Q_2) \quad (3)$$

a first modulation means for modulating a carrier with said signal $(I_1,Q_1)$ and generating a first modulated wave;

a second modulation means for modulating a carrier with said signal $(I_2,Q_2)$ and generating a second modulated wave;

a first amplification means for power amplifying said first modulated wave;

a second amplification means for power amplifying said second modulated wave; and means for composing output signals of said first amplification means and said second amplification means.

2. The transmitter of claim 1, wherein said conversion means converts a signal of said modulating signal (I,Q) to a signal $(I_1,Q_1)$ and a signal $(I_2,Q_2)$ by applying the following equations (4) to (7):

$$I_1=\{I+Q\cdot SQRT(4/a^2-1)\}/2 \quad (4)$$

$$Q_1=\{Q-I\cdot SQRT(4/a^2-1)\}/2 \quad (5)$$

$$I_2=\{I-Q\cdot SQRT(4/a^2-1)\}/2 \quad (6)$$

$$Q_2=\{Q+I\cdot SQRT(4/a^2-1)\}/2 \quad (7),$$

where, SQRT(x) refers to a square root of x, that is, $a^2=(I_2)^2+(Q_2)^2$.

3. The transmitter of claim 1, wherein said first modulation means and said second modulation means are quadrature modulators.

4. The transmitter of claim 1, wherein said first amplification means and said second amplification means are non-linear power amplifiers.

5. A transmitter comprising:

means for converting a signal of said modulating signal (I,Q) to a signal $(I_1,Q_1)$ and a signal $(I_2,Q_2)$ by applying the following equations (1) to (4):

$$I_1=\{I+Q\cdot SQRT(4/a^2-1)\}/2 \quad (1)$$

$$Q_1=\{Q-I\cdot SQRT(4/a^2-1)\}/2 \quad (2)$$

$$I_2=\{I-Q\cdot SQRT(4/a^2-1)\}/2 \quad (3)$$

$$Q_2=\{Q+I\cdot SQRT(4/a^2-1)\}/2 \quad (4);$$

where, SQRT(x) refers to a square root of x, that is, $a^2=(I_2)^2+(Q_2)^2$ a first quadrature modulation means for quadrature modulating a carrier with said signal $(I_1,Q_1)$ and generating a first modulated wave;

a second quadrature modulation means for quadrature modulating a carrier with said signal $(I_2,Q_2)$ and generating a second modulated wave;

a first non-linear power amplifier power amplifying said first modulated wave;

a second non-linear power amplifier power amplifying said second modulated wave; and means for composing output signals of said first non-linear power amplifier and said second non-linear power amplifier.

6. A method for transmitting a modulated wave with envelope variation, said method comprising the steps of:

converting a signal of said modulating signal with envelope variation of which in-phase component signal is I and quadrature component signal is Q to a signal of which in-phase component signal is $I_1$, and quadrature component signal is $Q_1$ and a signal of which in-phase component signal is $I_2$, and quadrature component signal is $Q_2$ that meet the following conditions (1) to (3):

$$(I_1)^2+(Q_1)^2=\text{constant} \quad (1)$$

$$(I_2)^2+(Q_2)^2=\text{constant} \quad (2)$$

$$\text{Vector }(I,Q)=\text{Vector }(I_1,Q_1)+\text{Vector }(I_2,Q_2) \quad (3);$$

a first modulation step of modulating a carrier with said signal $(I_1,Q_1)$ and generating a first modulated wave;

a second modulation step of modulating a carrier with said signal $(I_2,Q_2)$ and generating a second modulated wave;

a first amplification step of power amplifying said first modulated wave;

a second amplification step of power amplifying said second modulated wave;

composing said first power amplified modulated wave and said second power amplified modulated wave;

band limiting a composed modulated wave; and transmitting a band limited modulated wave.

7. The method of claim 6, wherein said conversion step comprises a step of converting a signal of said modulating signal (I,Q) to a signal $(I_1,Q_1)$ and a signal $(I_2,Q_2)$ by applying the following equations (4) to (7):

$$I_1=\{I+Q\cdot SQRT(4/a^2-1)\}/2 \quad (4)$$

$$Q_1=\{Q-I\cdot SQRT(4/a^2-1)\}/2 \quad (5)$$

$$I_2=\{I-Q\cdot SQRT(4/a^2-1)\}/2 \quad (6)$$

$$Q_2=\{Q+I\cdot SQRT(4/a^2-1)\}/2 \quad (7),$$

where, SQRT(x) refers to a square root of x, that is, $a^2=(I_2)^2+(Q_2)^2$.

8. The method of claim 6, wherein said first modulation step comprises a step of quadrature modulating a carrier with said signal $(I_1,Q_1)$; and said second modulation step comprises a step of quadrature modulating a carrier with said signal $(I_2,Q_2)$.

9. The method of claim 6, wherein said first amplification step comprises a step of nonlinear power amplifying said first modulated wave; and said second amplification step comprises a step of non-linear power amplifying said second modulated wave.

10. A transmitter comprising:

a converter converting a signal of said modulating signal with envelope variation of which in-phase component signal is I and quadrature component signal is Q to a signal of which in-phase component signal is $I_1$, and quadrature component signal is $Q_1$ and a signal of which in-phase component signal is $I_2$, and quadrature component signal is $Q_2$ that meet the following conditions (1) to (3):

$$(I_1)^2+(Q_1)^2 = \text{constant} \qquad (1)$$

$$(I_2)^2+(Q_2)^2 = \text{constant} \qquad (2)$$

$$\text{Vector }(I,Q) = \text{Vector }(I_1,Q_1) + \text{Vector }(I_2,Q_2) \qquad (3),$$

a first modulator modulating a carrier with said signal $(I_1,Q_1)$ and generating a first modulated wave;

a second modulator modulating a carrier with said signal $(I_2,Q_2)$ and generating a second modulated wave;

a first amplifier power amplifying said first modulated wave;

a second amplifier power amplifying said second modulated wave; and a composition device composing output signals of said first amplifier and said second amplifier.

11. The transmitter of claim 10, wherein said converter converts a signal of said modulating signal (I,Q) to a signal $(I_1,Q_1)$ and a signal $(I_2,Q_2)$ by applying the following equations (4) to (7):

$$I_1=\{I+Q\cdot SQRT(4/a^2-1)\}/2 \qquad (4)$$

$$Q_1=\{Q-I\cdot SQRT(4/a^2-1)\}/2 \qquad (5)$$

$$I_2=\{I-Q\cdot SQRT(4/a^2-1)\}/2 \qquad (6)$$

$$Q_2=\{Q+I\cdot SQRT(4/a^2-1)\}/2 \qquad (7),$$

where, SQRT(x) refers to a square root of x, that is, $a^2=(I_2)^2+(Q_2)^2$.

12. The transmitter of claim 10, wherein said first modulator and said second modulator are quadrature modulators.

13. The transmitter of claim 10, wherein said first amplifier and said second amplifier are non-linear power amplifiers.

14. A transmitter comprising:

a converter converting a signal of said modulating signal (I,Q) to a signal $(I_1,Q_1)$ and a signal $(I_2,Q_2)$ by applying the following equations (1) to (4):

$$I_1=\{I+Q\cdot SQRT(4/a^2-1)\}/2 \qquad (1)$$

$$Q_1=\{Q-I\cdot SQRT(4/a^2-1)\}/2 \qquad (2)$$

$$I_2=\{I-Q\cdot SQRT(4/a^2-1)\}/2 \qquad (3)$$

$$Q_2=\{Q+I\cdot SQRT(4/a^2-1)\}/2 \qquad (4),$$

where, SQRT(x) refers to a square root of x, that is, $a^2=(I_2)^2+(Q_2)^2$;

a first quadrature modulator quadrature modulating a carrier with said signal $(I_1,Q_1)$ and generating a first modulated wave;

a second quadrature modulator quadrature modulating a carrier with said signal $(I_2,Q_2)$ and generating a second modulating wave;

a first non-linear power amplifier power amplifying said first modulated wave;

a second non-linear power amplifier power amplifying said second modulated wave; and a composition device composing output signals of said first non-linear power amplifier and said second non-linear power amplifier.

* * * * *